(12) United States Patent
Kim

(10) Patent No.: US 8,507,344 B2
(45) Date of Patent: Aug. 13, 2013

(54) SEMICONDUCTOR DEVICE HAVING A BURIED GATE AND METHOD FOR MANUFACTURING THE SAME

(75) Inventor: Chan Woo Kim, Seoul (KR)

(73) Assignee: Hynix Semiconductor Inc., Icheon (KR)

(*) Notice: Subject to any disclaimer, the term of this patent is extended or adjusted under 35 U.S.C. 154(b) by 87 days.

(21) Appl. No.: 12/979,325

(22) Filed: Dec. 27, 2010

(65) Prior Publication Data

US 2012/0025314 A1   Feb. 2, 2012

(30) Foreign Application Priority Data

Aug. 2, 2010  (KR) .................. 10-2010-0074634

(51) Int. Cl.
*H01L 21/336* (2006.01)
(52) U.S. Cl.
USPC ........... 438/270; 438/253; 438/259; 438/589; 257/E21.008; 257/E21.658
(58) Field of Classification Search
USPC ........... 438/253, 270; 257/E21.008, E21.658
See application file for complete search history.

(56) References Cited

U.S. PATENT DOCUMENTS

| 2008/0102578 A1 | 5/2008 | Schlosser | |
| 2009/0053899 A1* | 2/2009 | Liu et al. | 438/703 |
| 2010/0102371 A1* | 4/2010 | Yeom | 257/296 |
| 2011/0070716 A1* | 3/2011 | Kim | 438/386 |

FOREIGN PATENT DOCUMENTS

KR   102010074635 A   7/2010

* cited by examiner

*Primary Examiner* — Hsin-Yi Hsieh

(57) ABSTRACT

A semiconductor device and a method for manufacturing the same are disclosed. The method for forming the semiconductor device includes forming one or more buried gates in a semiconductor substrate, forming a landing plug between the buried gates, forming a bit line region exposing the landing plug over the semiconductor substrate, forming a glue layer in the bit line region, forming a bit line material in the bit line region, and removing the glue layer formed at inner sidewalls of the bit line region, and burying an insulation material in a part where the glue layer is removed. A titanium nitride (TiN) film formed at sidewalls of the damascene bit line is removed, so that resistance of the bit line is maintained and parasitic capacitance of the bit line is reduced, resulting in the improvement of device characteristics.

9 Claims, 10 Drawing Sheets

US 8,507,344 B2

SEMICONDUCTOR DEVICE HAVING A BURIED GATE AND METHOD FOR MANUFACTURING THE SAME

CROSS-REFERENCE TO RELATED APPLICATION

The priority of Korean patent application No. 10-2010-0074634 filed on 2 Aug. 2010, the disclosure of which is hereby incorporated in its entirety by reference, is claimed.

BACKGROUND OF THE INVENTION

Embodiments of the present invention relate to a semiconductor device and a method for manufacturing the same, and more particularly to a semiconductor device including a damascene bit line and a method for manufacturing the same.

As an integration degree of a semiconductor device is rapidly increased, the size of a semiconductor device channel length is gradually decreased. Accordingly, it is more difficult to guarantee a sufficient sensing margin for operation of the semiconductor device. The most important factor in guaranteeing the sensing margin is as follows. As the semiconductor device is reduced in size, a storage electrode is reduced in size, so that it is difficult to guarantee capacity of the storage electrode. In addition, it is also difficult to reduce the parasitic capacitance of a bit line to a desired level. This substantially affects the sensing margin. This parasitic capacitance is decided by various factors, for example, permittivity of an insulator formed between conductors, a facing area of the conductors, and a distance between the conductors. The distance between the conductors is gradually shortened, such that it is difficult to reduce the parasitic capacitance to a desired level. In order to overcome this problem, a method for reducing the size of a bit line or the size of a storage electrode contact has been introduced, but the aforementioned method increases the cell resistance.

As described above, as the integration degree of the semiconductor device is rapidly increased, the difficulty of forming a hole-type storage electrode contact in a cell array is also increased. As a result, instead of using the conventional method for forming the bit line and then forming the hole-type storage electrode contact, there has been proposed a new method in which a line-type storage electrode contact is formed and a bit line is formed by a damascene technique, so that the line-type storage electrode contact can be separated from the bit line.

However, the above-mentioned method for forming the bit line using the above-mentioned damascene technique has a disadvantage in that the bit line is formed closer to the storage electrode contact. In addition, a titanium nitride (TiN) film is formed over the sidewalls of the bit line as well as at the bottom of the bit line, resulting in increased parasitic capacitance.

BRIEF SUMMARY OF THE INVENTION

Various embodiments of the present invention are directed to providing a semiconductor device and a method for manufacturing the same that substantially obviate one or more problems due to limitations and disadvantages of the related art.

An object of the present invention is to provide a semiconductor device including a damascene bit line and a method for manufacturing the same.

In accordance with an aspect of the present invention, a semiconductor device comprising: first and second buried gates; a landing plug formed between the first and second buried gates; and a damascene bit line coupled to the landing plug, the damascene bit line including a glue layer formed at a lower surface of the damascene bit line and an insulation layer formed over sidewalls of the damascene bit line.

The insulation layer is disposed on the entire sidewalls of the damascene bit line or an upper portion of the sidewalls of the damascene bit line.

The insulation layer includes an oxide film, a nitride film, or a combination thereof.

The insulation layer includes an air layer or a vacuum layer.

The glue layer includes a titanium nitride (TiN) film.

The damascene bit line includes tungsten.

Further comprising: a protection film formed over the damascene bit line.

The protection film includes a nitride film.

In accordance with another aspect of the present invention, a method for forming a semiconductor device, the method comprising: forming first and second buried gates in a semiconductor substrate; forming a landing plug between the first and second buried gates; forming a bit line region to expose the landing plug over the semiconductor substrate; forming a glue layer on sidewalls and at a lower surface of the bit line region; forming a bit line layer in the bit line region where the glue layer is formed; removing a portion of the glue layer formed over the sidewalls of the bit line region; and forming an insulation layer in a space where the glue layer formed over the sidewalls of the bit line region is removed.

The bit line layer includes tungsten.

The glue layer includes a titanium nitride (TiN) film.

Removing the glue layer includes removing a portion of the glue layer formed over the entire sidewalls of the bit line region or a portion of the glue layer formed over an upper portion of the sidewalls of the bit line region.

The insulation layer includes forming a nitride film over the entire surface of the bit line region including the space where the glue layer is removed. The insulation layer includes: burying an oxide film in the space where the glue layer is removed.

Further comprising forming a protection film over the oxide film and the bit line layer after burying the oxide film, wherein the protection film includes a nitride film. Forming the insulation layer includes: forming an air layer or a vacuum layer in the space where the glue layer is removed.

Further comprising: forming a protection film over the bit line layer and the air layer or vacuum layer to form a damascene bit line after forming the air layer or the vacuum layer.

The protection film includes any one selected from among an oxide film, a nitride film and a combination thereof.

Removing the glue layer is carried out by dry etching. Removing the glue layer is carried out by an etch-back process.

In the forming of the bit line material, the bit line material may include tungsten. In the removing of the glue layer, the entire parts of the glue layer or only the upper part of the glue layer may be removed. In the forming of the damascene bit line by forming the protection film, the protection film may include a nitride film. The protection film may include an oxide film, a nitride film, or a combination thereof. The removing of the glue layer may be carried out by dry etching. The removing of the glue layer may be carried out by an etch-back process.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the accompanying drawings.

Figure 1:
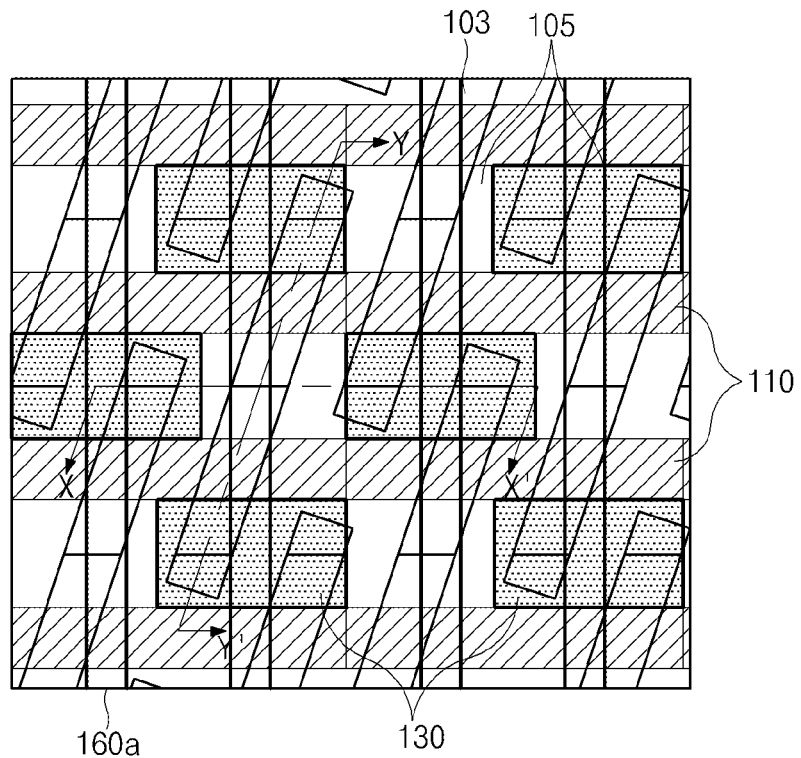
FIG. 1 is a plan view illustrating a semiconductor device including a damascene bit line according to an embodiment of the present invention.

FIG. 1 is a plan view illustrating a semiconductor device including a general damascene bit line. Referring to FIG. 1, an active region 103 and a device isolation film 105 defining the active region 103 are formed over a semiconductor substrate. Two gates 110 are formed to cross each other in each active region 103, and each gate 110 may be formed to be buried in a lower part of the semiconductor substrate. In addition, a damascene bit line 160*a* is formed perpendicular to the gates 110.

Figure 2:
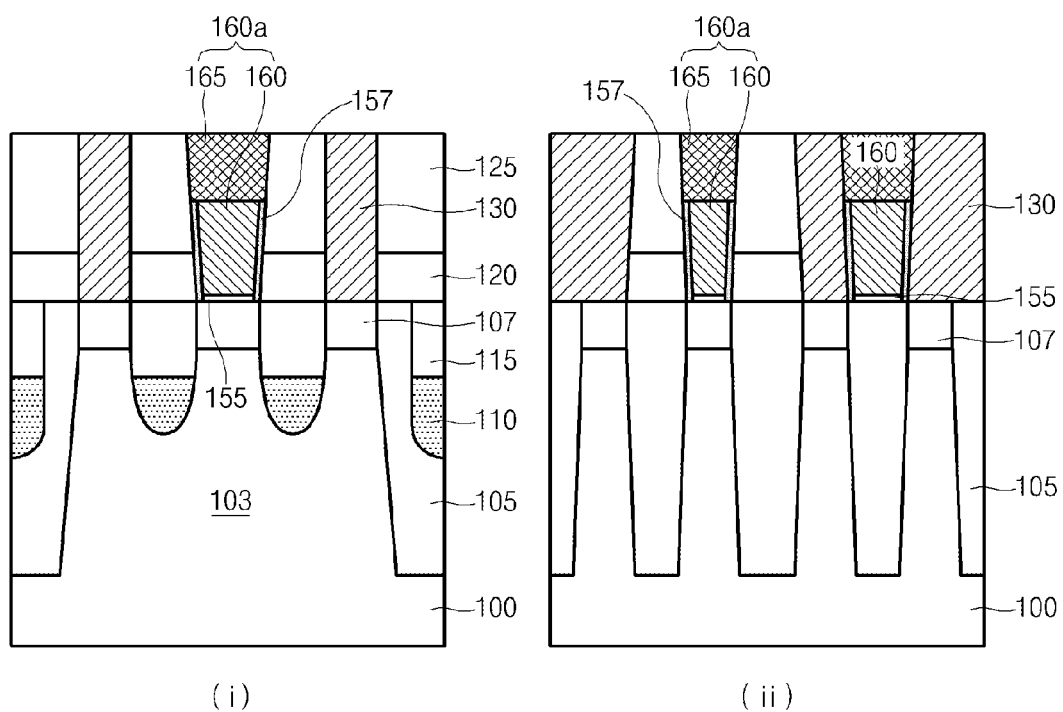
FIGS. 2 (*i*) and (*ii*) are cross-sectional views of a semiconductor device according to the present invention, wherein (*i*) is a cross-sectional view illustrating the semiconductor device taken along a Y-Y' line shown in FIG. 1, and (*ii*) is a cross-sectional view illustrating the semiconductor device taken along an X-X' line shown in FIG. 1.

FIG. 2 is a semiconductor device according to the present invention. FIG. 2 (*i*) is a cross-sectional view illustrating the semiconductor device taken along a Y-Y' line shown in FIG. 1. FIG. 2 (*ii*) is a cross-sectional view illustrating the semiconductor device taken along an X-X' line shown in FIG. 1.

Referring to FIG. 2, the buried gate 110 is formed within a semiconductor substrate 100 including the active region 103 and the device isolation film 105. A landing plug 107 is formed between two neighboring buried gates 110 in the active region 103. Then, a glue layer 155 is formed over the sidewalls and at the bottom (or a lower surface) of a bit line region where a bit line is to be formed over the semiconductor substrate 100.

In addition, a storage electrode contact 130 and a damascene bit line layer 160 are formed over the semiconductor substrate 100, wherein the damascene bit line layer 160 is formed in the bit line region. The storage electrode contact 130 is coupled to the landing plug 107 formed at both edges of the active region 103, and the damascene bit line layer 160 is coupled to the landing plug 107 formed at a central portion of the active region 103.

After that, a portion of the glue layer 155 formed over the sidewalls of the bit line region is removed. An insulation layer 157 including a nitride film or an oxide film is deposited on the sidewalls of the damascene bit line layer 160, i.e., in a space where the portion of the glue layer 155 is removed, and a protection film 165 is formed over the damascene bit line layer 160. In accordance with another embodiment, the insulation layer 157 may not be deposited on the sidewalls of the damascene bit line layer 160, and a sidewall space of the damascene bit line layer 160 is empty. Thus, in the sidewall space of the damascene bit line layer 160, an air layer or a vacuum layer is formed. After that the protection film 165 is formed over the damascene bit line layer 160 and the air or vacuum layer. As described above, the glue layer 155 including a nitride film such as a TiN film formed over the sidewalls of the damascene bit line layer 160 is removed, and the insulation material 157 is buried in the space where the glue layer 155 is removed, thereby forming the damascene bit line 160*a*. As a result, the bit line resistance is maintained, and at the same time parasitic capacitance is reduced, so that device characteristics are improved.

FIGS. 3A to 3J are cross-sectional views illustrating a method for manufacturing the semiconductor device shown in FIG. 1. In FIGS. 3A to 3J, (*i*) is a cross-sectional view illustrating the semiconductor device taken along the Y-Y' line shown in FIG. 1, and (*ii*) is a cross-sectional view illustrating the semiconductor device taken along the X-X' line shown in FIG. 1.

Figure 3A:
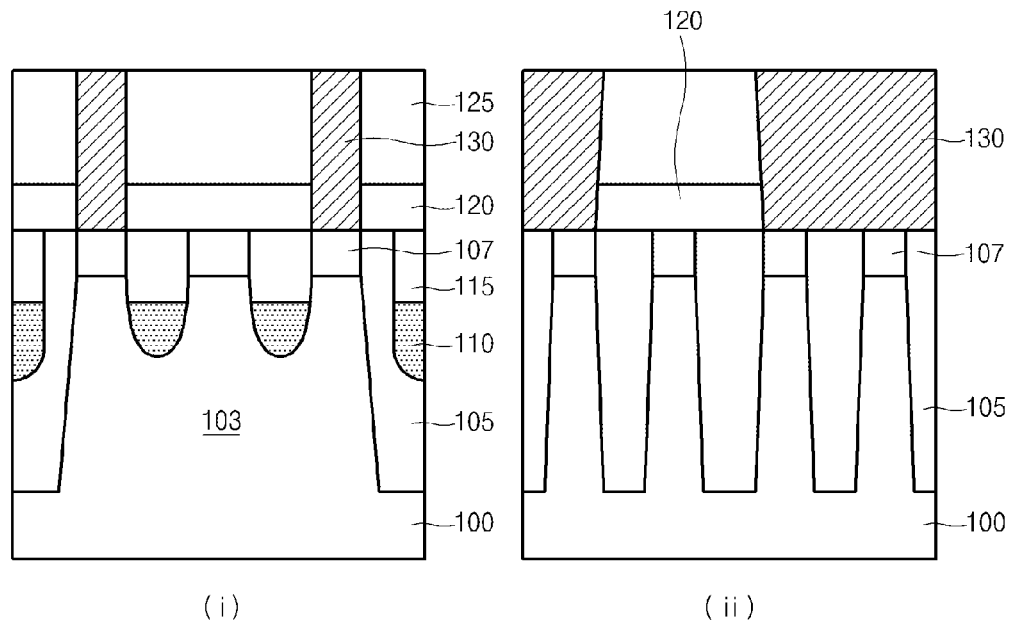
FIGS. 3A to 3J are cross-sectional views illustrating a method for manufacturing a semiconductor device according to one embodiment of the present invention, wherein (*i*) is a cross-sectional view illustrating the semiconductor device taken along the Y-Y' line shown in FIG. 1, and (*ii*) is a cross-sectional view illustrating the semiconductor device taken along the X-X' line shown in FIG. 1.

Referring to FIG. 3A, a first hard mask pattern (not shown) is formed over the active region 103 of the semiconductor substrate 100. The semiconductor substrate 100 is etched using the first hard mask pattern (not shown) as an etch mask, so that a trench for defining the active region 103 is formed. Then, an oxide film is formed over the semiconductor substrate 100 including the trench, and a chemical mechanical polishing (CMP) process is performed until the first hard mask pattern (not shown) is exposed, so that the device isolation film 105 is formed.

In this case, the first hard mask pattern (not shown) remains over the active region 103, and the top surface of the first hard mask pattern (not shown) is in substantially the same level as that of the device isolation film 105. If the first hard mask pattern (not shown) is formed of a nitride film, the hard mask formed of the nitride film is removed, and at the same time a landing plug is easily formed in a subsequent process.

Subsequently, a recess for forming a gate is formed in the active region 103 and the device isolation film 105 which are formed within the semiconductor substrate 100. A gate oxide film (not shown) is formed by oxidizing the surface of the recess. A conductive material is buried at the bottom of the recess including the gate oxide film (not shown), so that the buried gate 110 is formed. The buried gate 110 may include titanium nitride (TiN) and tungsten (W). A capping film 115 for protecting the buried gate 110 is formed over the buried gate 110. The capping film 115 may include a nitride film.

Subsequently, the first hard mask pattern (not shown) is removed, and a landing plug material is buried in a space formed by removing the first hard mask pattern (not shown), so that the landing plug 107 is formed. The landing plug 107 is coupled to a junction region (source/drain), a bit line contact plug, and a storage electrode contact plug in the semiconductor substrate 100. The landing plug material may include a conductive material to form the landing plug 107. For example, the landing plug 107 may include polysilicon.

Preferably, in the process for forming the landing plug 107, the conductive material such as polysilicon is deposited over the semiconductor substrate 100 including the space formed by removing the first hard mask pattern (not shown), and a CMP or etch-back process is performed over the resultant structure until the capping film 115 over the buried gate 110 is exposed. The landing plug 107 may be deposited with doped polysilicon. Alternatively, in order to form the landing plug 107, after the polysilicon deposition, an ion implantation process may be performed, and the resultant structure is then doped. In the case of forming the landing plug 107, the loss of the semiconductor substrate 100 may be prevented by forming a bit line using a damascene process, and a junction region may be formed to have a small thickness. A metal plug is not directly formed over the top surface of the active region 103, so that the landing plug 107 may be used as a shock absorber. In addition, an overlap region between the active region 103 and the landing plug 107 is increased, resulting in the reduction of the plug resistance.

Subsequently, a sealing nitride film 120 for protecting the buried gate 110 and the landing plug 107 is formed over the landing plug 107, the buried gate 110, and the device isolation film 105. Thereafter, an interlayer insulation film 125 is formed over the sealing nitride film 120. In addition, the interlayer insulation film 125 and the sealing nitride film 120 are selectively etched so that a storage electrode contact hole for exposing the landing plug 107 is formed. In this case, as shown in FIG. 3A (ii) and FIG. 1, a storage electrode contact hole including storage electrode regions of two contiguous active regions 103 is formed. In other words, storage electrode contact holes of the two contiguous active regions 103 are formed as one storage electrode contact hole. Thereafter, a conductive material is buried in the storage electrode contact hole so that the storage electrode contact plug 130 is formed.

Figure 3B:
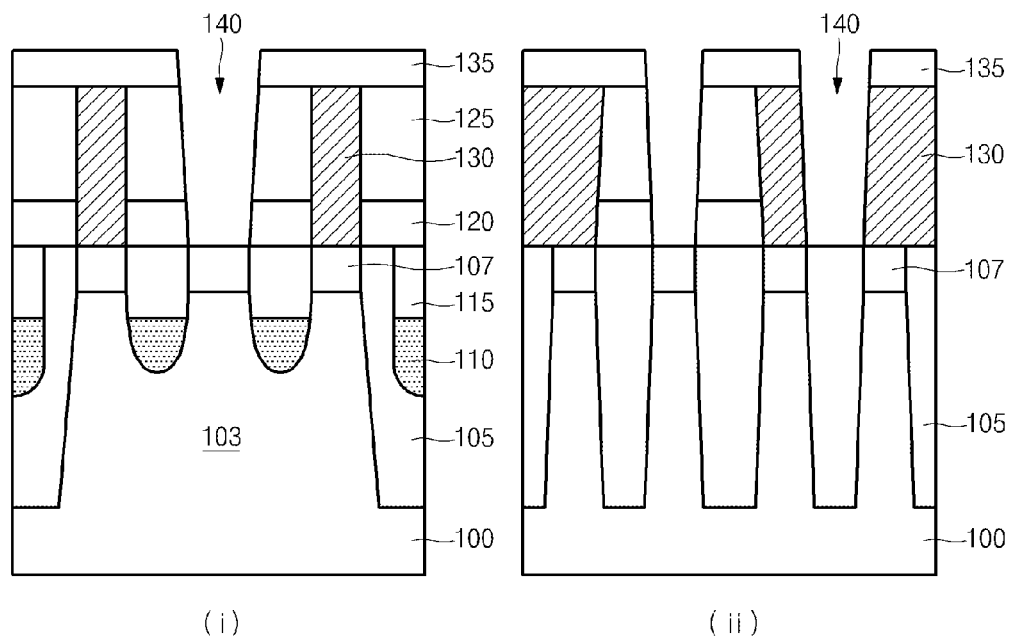

Referring to FIG. 3B, a second hard mask pattern 135 for defining a bit line contact region is formed over the first interlayer insulation film 125 and the storage electrode contact plug 130. The first interlayer insulation film 125 is selectively etched using the second hard mask pattern 135 as an etch mask, so that a bit line region 140 is formed. In a subsequent process, the bit line region 140 defines a region in which a bit line is to be formed, and isolates each storage electrode contact plug 130 formed between contiguous active regions 103 so that the storage electrode contact plug 130 is independently coupled to each active region 103.

Figure 3C:
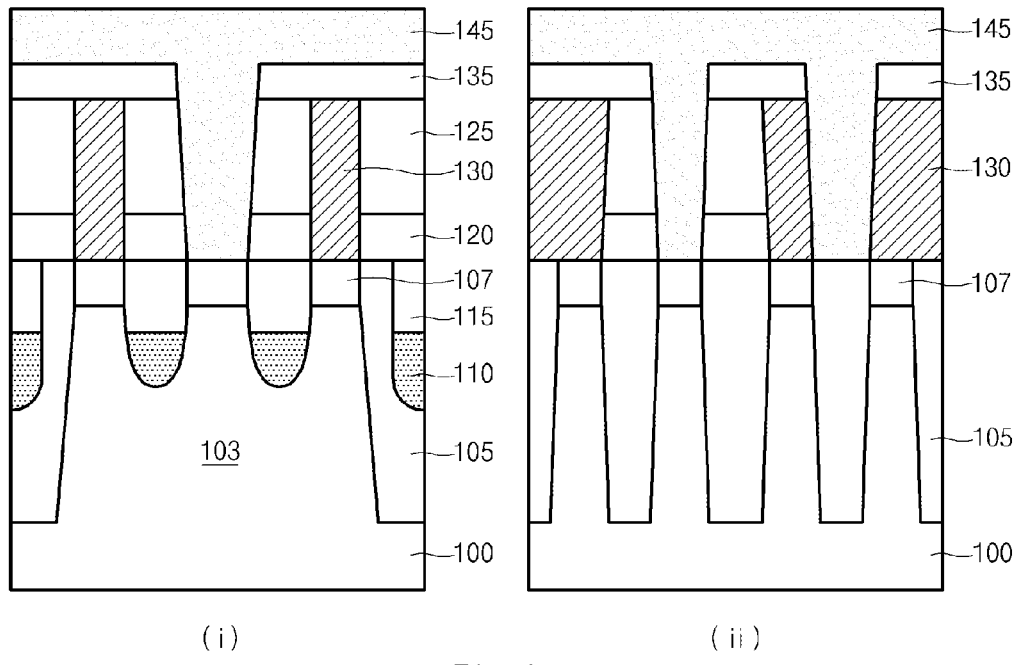

Referring to FIG. 3C, a bit line spacer (not shown) is deposited on the sidewalls of the bit line region 140. The bit line spacer (not shown) may be formed of a material including a nitride film. In addition, a third hard mask layer 145 is formed over the entire surface of the semiconductor substrate 100 including the bit line region 140 where the bit line spacer (not shown) is deposited.

Figure 3D:
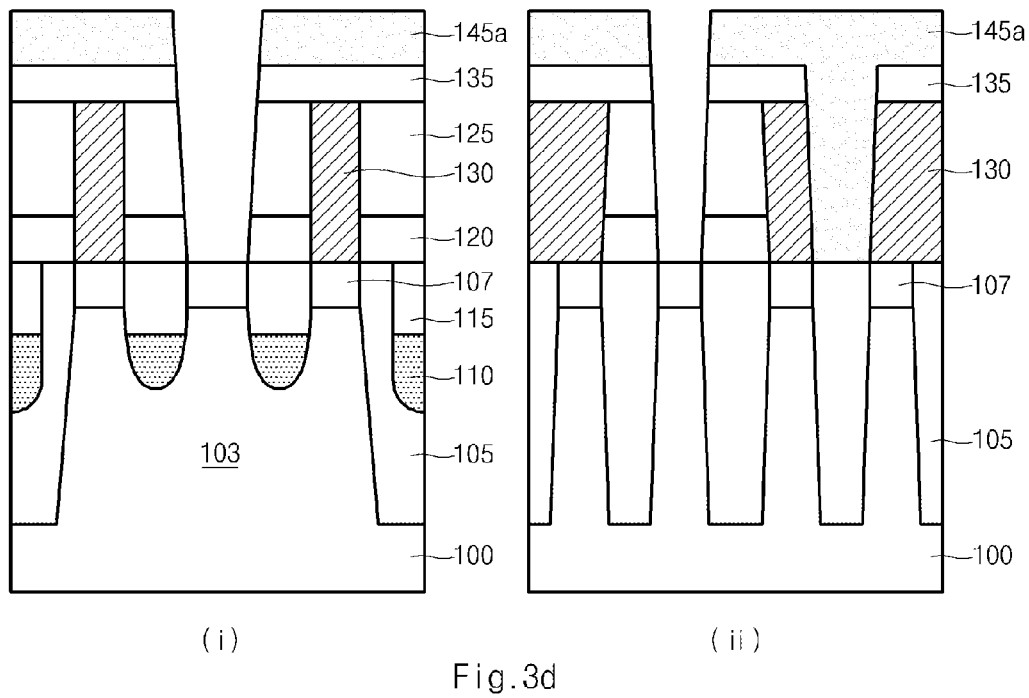

Referring to FIG. 3D, a portion of the third hard mask layer 145 buried in the bit line region 140 is removed, so that a third hard mask pattern 145a is formed to expose the landing plug 107. In this case, the bit line region 140 formed between two contiguous active regions 103 is in contact with the device isolation film 105, so that the bit line region 140 may not be opened.

Figure 3E:
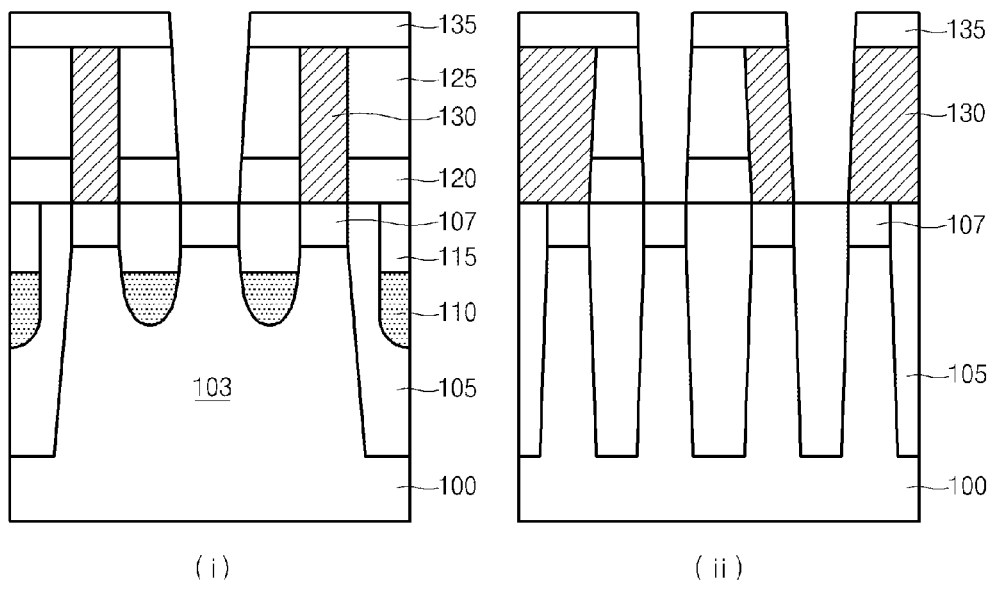

Referring to FIG. 3E, a barrier metal layer (not shown) is formed over inner sidewalls and at the bottom of the bit line region 140. The barrier metal layer (not shown) may be formed of titanium nitride (TiN), titanium (Ti), or a combination thereof. Thereafter, rapid thermal annealing is performed to form a titanium silicide (TiSix) film over the top surface of the landing plug 107 exposed by the bit line region 140. Afterwards, the third hard mask pattern 145a is removed.

Figure 3F:
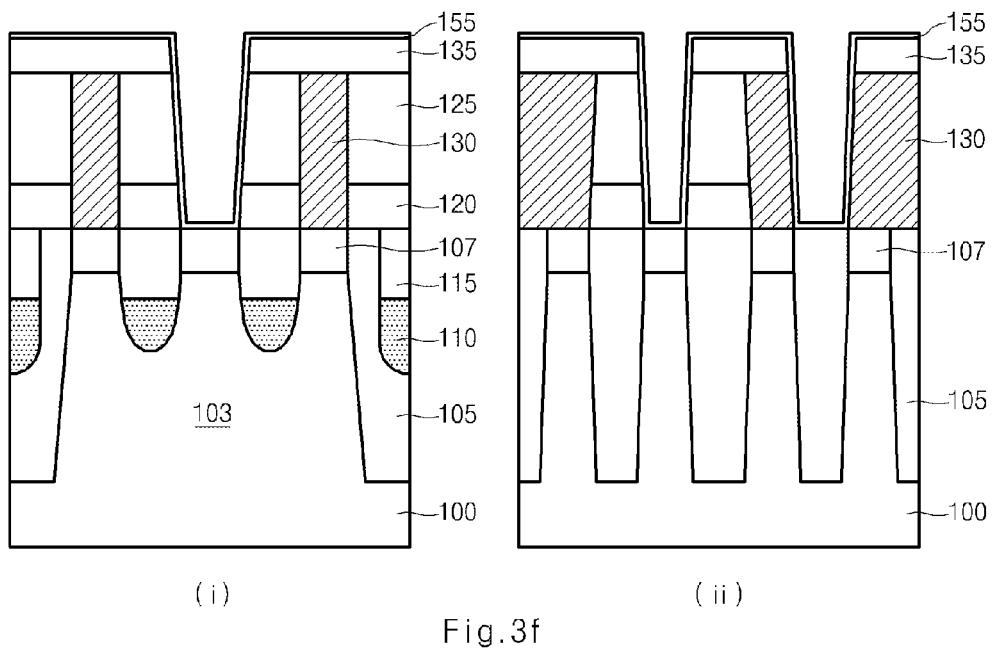

Referring to FIG. 3F, after the barrier metal layer (not shown) is removed, a glue layer 155 including a titanium nitride (TiN) film is formed over the bit line region 140 and the second hard mask pattern 135. In this case, the titanium nitride (TiN) film 155 may be formed to compensate for a crack encountered in the above-mentioned rapid thermal annealing.

Figure 3G:
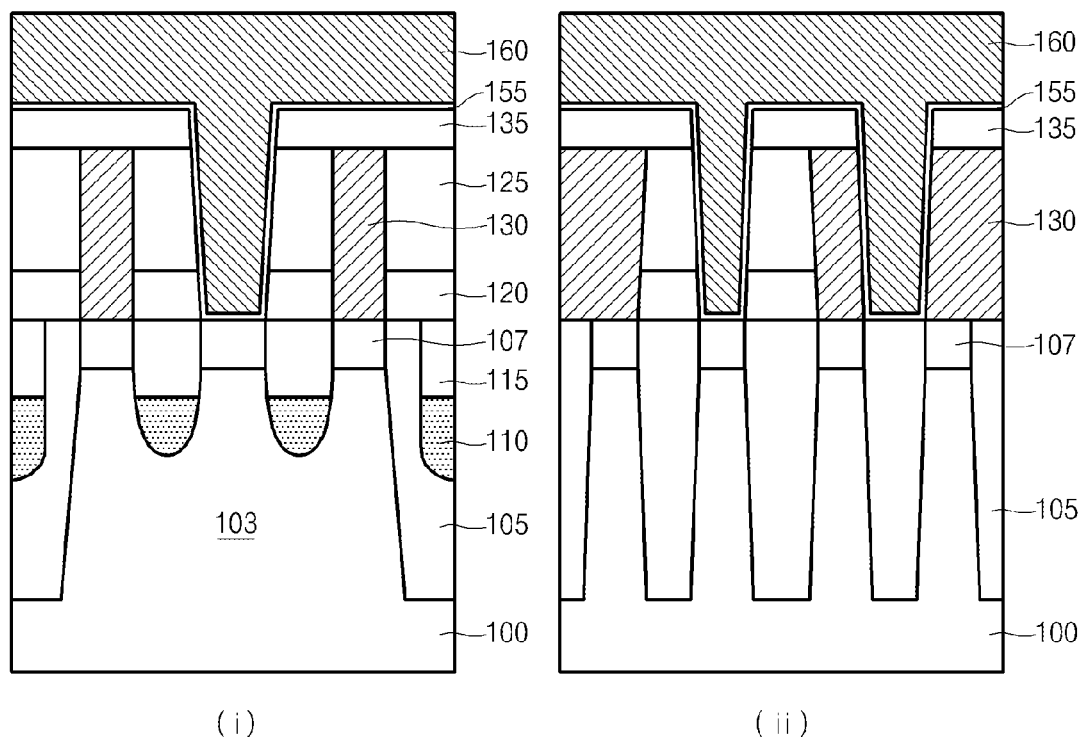

Referring to FIG. 3G, a bit line material layer 160 is formed over the entire surface of the semiconductor substrate 100 including the bit line region 140 and the TiN film 155. The bit line material layer 160 may include tungsten.

Figure 3H:
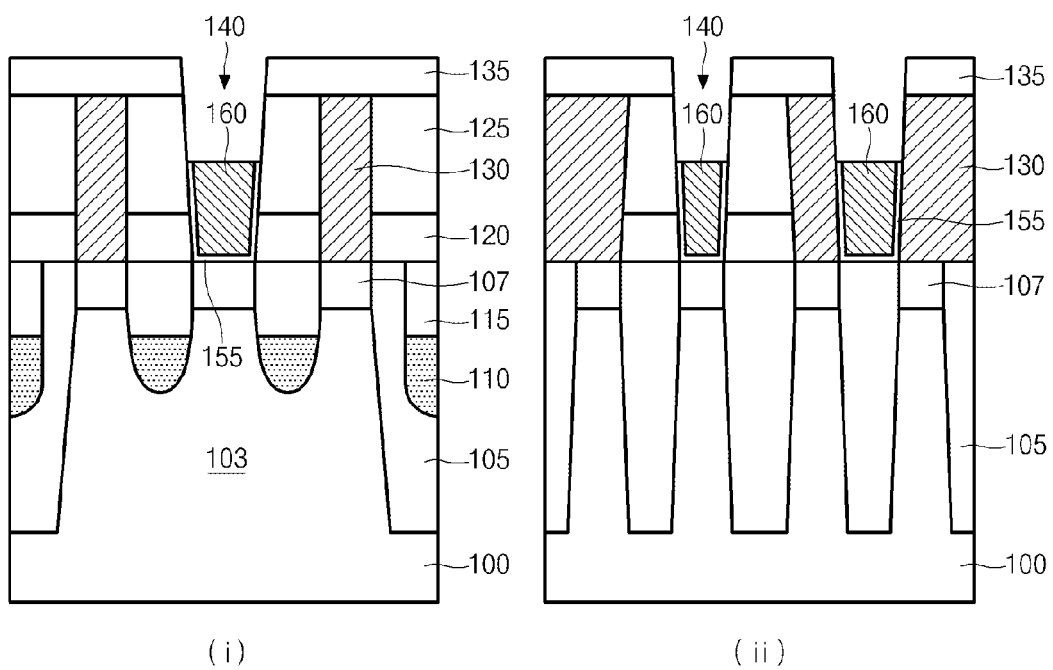

Referring to FIG. 3H, a CMP process is performed so that the bit line material layer 160 is etched until the second hard mask pattern 135 is exposed. Thereafter, the bit line material layer 160 and the TiN film 155 are further etched by an etch-back process, so that the bit line material layer 160 and the TiN film 155 remain only at a lower portion of the bit line region 140. In this case, an upper portion of the second hard mask pattern 135 may be partially etched.

Figure 3I:
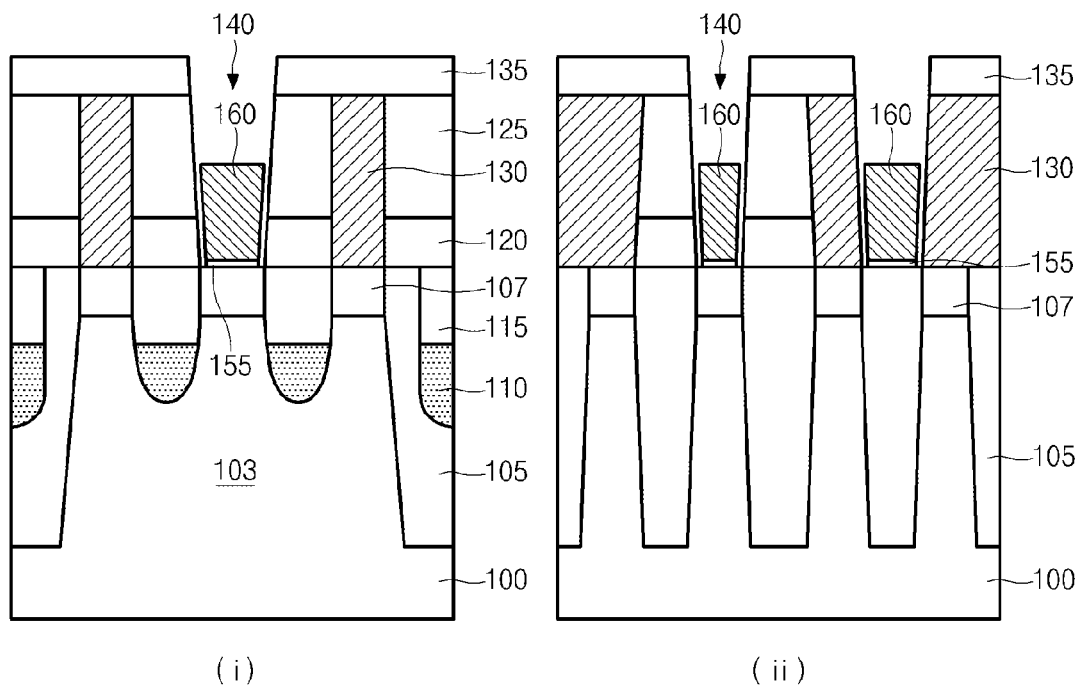

Referring to FIG. 3I, a selective etching process is performed so that the TiN film 155 formed at on the sidewalls of the bit line region 140 is removed. In the formation of the damascene bit line, the TiN film 155 is no longer required after the bit line material layer 160 is deposited. As a result, although the TiN film 155 is removed, no problems are generated.

In this case, two methods may be used to remove the TiN film 155. The first method is to continuously perform the etch-back process used in a previous process, and the second method is to perform a dry etching process. The detailed description of the first method for performing the etch-back process is as follows. The first method uses a difference between etch rates of the TiN film 155 and the bit line material layer 160 formed of tungsten. The TiN film 155 is quickly etched as compared to the bit line material layer 160, so that the TiN film 155 is removed.

The detailed description of the second method for performing the dry etching process is as follows. The dry etching is carried out using an etch condition for removing only the TiN film 155. In this case, the TiN film 155 is not completely removed. That is, only parts of an upper portion of the TiN film 155 may be removed as necessary. However, when the TiN film 155 is completely removed, parasitic capacitance may be further improved.

Figure 3J:
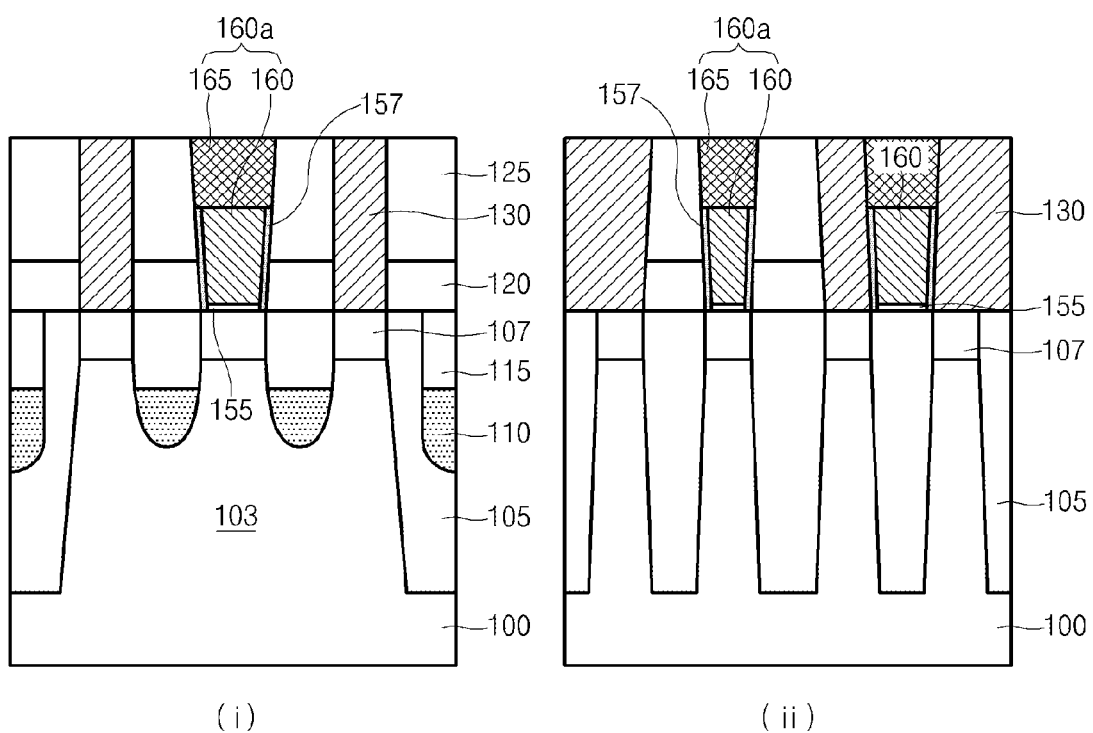

Referring to FIG. 3J, an insulation material 157 is buried in a space where the TiN film 155 is removed. In this case, the insulation material 157 may be formed of a material which includes a nitride film having a dielectric constant of 7.5 or an oxide film having a dielectric constant smaller than that of the nitride film.

First, a method for forming the insulation material 157 including the nitride film will be described in detail. The nitride film is formed over the entire surface of a resultant structure where the TiN film 155 is removed, and a planarization process is performed until the first interlayer insulation film 125 is exposed, so that a damascene bit line is formed. In this case, the nitride film is formed at a specific location where the TiN film 155 is removed and at the same time over the bit line material layer 160, so that a process for forming a protection film does not need to be additionally performed.

A method for forming the insulation material 157 including the oxide film will be described with reference to the accompanying drawings. Firstly, the oxide film is formed over the entire surface of the resultant structure where the TiN film 155 is removed, and an etch-back process is performed until the bit line material 160 is exposed. In other words, the oxide film is buried only in the part where the TiN film 155 is removed. Subsequently, a protection film 165 is formed over the bit line material layer 160, so that the damascene bit line 160a including the protection film 165 and the bit line material layer 160 is formed. The protection film 165 may be formed of a material including a nitride film. In this way, when the TiN film 155 formed over the sidewalls of the bit line region 140 is removed, the capacity of a storage node of the present invention may be enhanced by about 40% compared to those of the conventional art. The enhanced degree may be changed according to a shape of a storage electrode contact, a removal degree of the TiN film 155, a dielectric constant of the insulation material 157 buried in the space where the TiN film 155 is removed, and the like.

Figure 4:
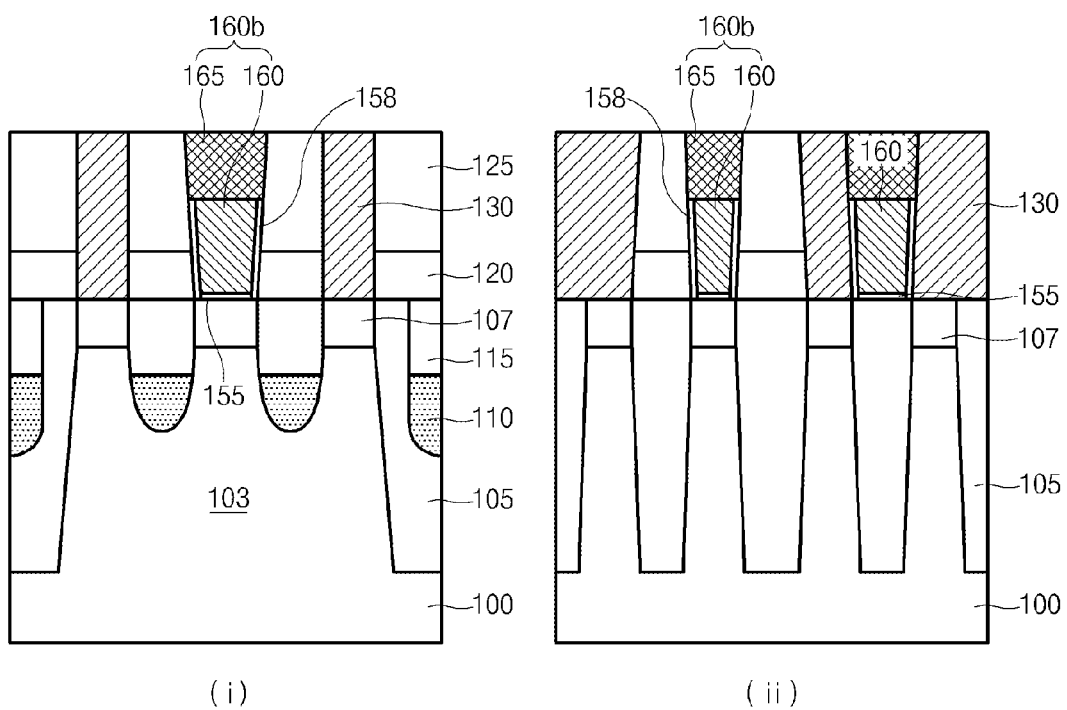
FIGS. 4(*i*) and 4(*ii*) illustrate a semiconductor device according to another embodiment of the present invention, illustrating a result of post-processes of FIGS. 3A to 3I.

FIGS. 4 (i) and 4 (ii) illustrate a semiconductor device according to another embodiment of the present invention. FIG. 4 shows a result of performing post-processes on the resultant structure shown in FIG. 3I.

Referring to FIG. 4, after the TiN film 155 formed over the sidewalls of the bit line region 140 is removed, the protection film 165 is buried in such a manner that step coverage characteristics are deteriorated at an upper portion of the bit line region 140 including the bit line material 160 formed at the lower portion thereof, so that a damascene bit line 160b is formed. Through the above-mentioned processes, the oxide film and the nitride film are not buried in the part where the TiN film 155 is removed. Instead, an air layer or a vacuum layer 158 is formed in the part where the TiN film 155 is removed. In this case, the air layer or the vacuum layer 158 may be adjusted by changing a chamber condition.

As apparent from the above description, the semiconductor device and a method for manufacturing the same according to embodiments of the present invention have the following effects. In accordance with the method for manufacturing the semiconductor device according to the present invention, the TiN film formed over sidewalls of the bit line region is removed, and a space where the TiN film is removed is filled with an insulation material. As a result, parasitic capacitance of the bit line is reduced without affecting resistance of the bit line, and thus unique characteristics of the semiconductor device are improved.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a semiconductor device, the method comprising:
   forming first and second buried gates in a semiconductor substrate;
   forming a landing plug between the first and second buried gates;
   forming a bit line region to expose the landing plug over the semiconductor substrate;
   forming a glue layer on sidewalls and a lower surface of the bit line region;
   forming a bit line layer over the glue layer;
   etching the bit line layer and the glue layer to form a remaining bit line layer and a remaining glue layer so that the remaining bit line layer and the remaining glue layer remain only at a lower portion of the bit line region;
   removing a portion of the remaining glue layer at the sidewalls of the remaining bit line layer; and
   forming an insulation layer in a space where the portion of the remaining glue layer is removed from the sidewalls of the remaining bit line layer.

2. The method according to claim 1, wherein the bit line layer includes tungsten.

3. The method according to claim 1, wherein the glue layer includes a titanium nitride (TiN) film.

4. The method according to claim 1, wherein removing the portion of the remaining glue layer at the sidewalls of the remaining bit line layer includes removing the portion of the remaining glue layer on the entire sidewalls of the remaining bit line layer or the portion of the remaining glue layer on an upper portion of the sidewalls of the remaining bit line layer.

5. The method according to claim 1, wherein forming the insulation layer includes forming a nitride film over the entire surface of the bit line region including the space where the portion of the remaining glue layer is removed.

6. The method according to claim 1, wherein forming the insulation layer includes:
   burying an oxide film in the space where the portion of the remaining glue layer is removed.

7. The method according to claim 6, further comprising forming a protection film over the oxide film and the remaining bit line layer after burying the oxide film, wherein the protection film includes a nitride film.

8. The method according to claim 1, wherein removing the portion of the remaining glue layer is carried out by dry etching.

9. The method according to claim 1, wherein removing the portion of the remaining glue layer is carried out by an etch-back process.

* * * * *